United States Patent
Bernier et al.

(10) Patent No.: US 8,907,747 B2
(45) Date of Patent: Dec. 9, 2014

(54) DEVICE USING A FILTER WITH RESONATORS

(75) Inventors: Carolynn Bernier, Grenoble (FR); Jean-Baptiste David, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 310 days.

(21) Appl. No.: 13/440,855

(22) Filed: Apr. 5, 2012

(65) Prior Publication Data

US 2012/0256705 A1 Oct. 11, 2012

(30) Foreign Application Priority Data

Apr. 7, 2011 (FR) ...................................... 11 53038

(51) Int. Cl.
| | | |
|---|---|---|
| H03H 9/54 | (2006.01) | |
| H03H 9/64 | (2006.01) | |
| H03H 7/01 | (2006.01) | |
| H03H 9/46 | (2006.01) | |
| H03H 9/15 | (2006.01) | |

(52) U.S. Cl.
CPC . *H03H 9/54* (2013.01); *H03H 9/64* (2013.01); *H03H 9/46* (2013.01); *H03H 9/15* (2013.01); *H03H 7/01* (2013.01)
USPC ............................. 333/190; 333/187; 333/193

(58) Field of Classification Search
CPC ....... H03H 3/02; H03H 9/173; H03H 9/0095; H03H 9/46; H03H 7/01; H03H 9/15; H03H 9/54; H03H 9/64
USPC ......... 333/186, 187, 190, 193, 194, 195, 196, 333/133; 310/313 B, 313 D
See application file for complete search history.

(56) References Cited

U.S. PATENT DOCUMENTS

| | | | | |
|---|---|---|---|---|
| 2,216,937 | A | | 10/1940 | Ciccolella |
| 2,249,415 | A | | 7/1941 | Bode |
| 5,847,626 | A | * | 12/1998 | Taguchi et al. ............... 333/193 |

(Continued)

FOREIGN PATENT DOCUMENTS

WO 2004/066490 A2 8/2004

OTHER PUBLICATIONS

Dan Swanson and Giuseppe Macchiarella, Apr. 2007 "Microwave Filter Design by Synthesis and Optimization", Microwave Magazine, IEEE (vol. 8, Issue:2), pp. 55-69.*

(Continued)

*Primary Examiner* — Benny Lee
*Assistant Examiner* — Jorge Salazar, Jr.
(74) *Attorney, Agent, or Firm* — Baker & Hostetler LLP (57) ABSTRACT

A filter device including an input electronic circuit having an input load admittance Yin, an output electronic circuit having an output load admittance Yout, a lattice filter with two types of two piezoelectric resonators having a characteristic impedance Zc; those of the first type have a resonant frequency Fr1 and an antiresonant frequency Fa1; those of the second type have a resonant frequency Fr2 different from Fr1 and an antiresonant frequency Fa2 different from Fa1. The input and output impedances are matched to the reciprocal of the real part Re{Yin} of the admittance Yin and the reciprocal of the real part Re{Yout} of the admittance Yout, which are at least two to five times greater than the characteristic impedance Zc of the resonators. The frequency differences Fa1−Fr1 and Fa2−Fr2 are at least two to three times greater than the absolute value of the difference Fr1−Fr2.

11 Claims, 4 Drawing Sheets

(56) References Cited

U.S. PATENT DOCUMENTS

| | | | |
|---|---|---|---|
| 6,388,544 B1 * | 5/2002 | Ella | 333/189 |
| RE40,036 E * | 1/2008 | Satoh et al. | 333/193 |
| 2003/0128081 A1 | 7/2003 | Ella et al. | |
| 2005/0057117 A1 * | 3/2005 | Nakatsuka et al. | 310/311 |

OTHER PUBLICATIONS

Search Report and Written Opinion of corresponding French application No. 1153038 issued on Dec. 16, 2011.

* cited by examiner

DEVICE USING A FILTER WITH RESONATORS

CROSS-REFERENCE TO RELATED APPLICATIONS

This application claims priority to foreign French patent application No. FR 11 53038, filed on Apr. 7, 2011, the disclosure of which is incorporated by reference in its entirety.

FIELD OF THE DISCLOSED SUBJECT MATTER

The invention concerns circuits using filters based on resonators, and more particularly filters for electrical signals in the UHF band, from a few hundred MHz to a few GHz.

BACKGROUND

An increasing number of mobile applications use a radio-frequency communication system to exchange data between different nodes. The production constraints are often low consumption constraints, especially when power is provided by batteries or systems for recovering ambient energy.

Because of the increasing number of applications, the UHF frequency bands around 2.4 GHz that are often employed by these systems, notably for industrial, scientific and medical applications, are more and more congested, thus increasing the number of interfering signals liable to saturate the input of the receiver. To provide protection against such interference, the designer of the system has the option either to increase the linearity of the receiver, generally at the cost of an increase in its electrical consumption, or to increase its selectivity, ideally a long way upstream in the reception chain and thus as close as possible to the antenna. This second approach thus creates a requirement for band-pass filters centered on UHF frequencies, having a relatively narrow bandwidth (of the order of the width reserved for a channel in the authorized frequency distribution), and able to be incorporated into the receiver with minimum impact on its electrical consumption.

The necessity to work directly at UHF frequencies rules out the use of active filtering techniques typically used at lower frequencies. The aim is therefore to use passive resonators operating directly at UHF frequencies, based for example on Surface Acoustic Wave (SAW) or Bulk Acoustic Wave (BAW) technologies, i.e. surface acoustic wave resonators and bulk acoustic wave resonators.

Such resonators may be used as individual resonators associated with an active circuit which thus benefits from the frequency selectivity of the resonator around its resonant frequency or antiresonant frequency, or as a set of individual resonators separated from each other by active elements, or as resonators in a purely passive filter itself associated with an input circuit and an output circuit, each of which two circuits may be active or passive. The filter functions obtained with individual resonators have limited selectivity and do not always provide a sufficiently flat bandwidth in the useful band. For their part, active circuits cause the structure to consume more energy, which is undesirable.

In the prior art, passive filters have already been proposed based on one or more lattice cells (known as "lattice filters") with differential input and output, each cell employing four resonators connected in "direct" and "crossed" manner between the input and the output of the cell. Two types of resonator are conventionally used to produce "series" or "parallel" resonators. Each resonator has a characteristic impedance Zc, a resonant frequency (Fr) and an antiresonant frequency (Fa), where Fa>Fr. The resonant frequencies of one type of resonator are different from those of the other type, and the same applies to the antiresonant frequencies. The resonant frequency of the resonators of a first type is conventionally made equal to the antiresonant frequency of the second type, to obtain a bandwidth sufficiently flat around the center frequency of the band.

These lattice filters are placed between an input circuit and an output circuit, and it is generally accepted that the input circuit impedance is matched to the impedance of the filter as seen from its input when it is loaded by an output circuit, and likewise the output circuit impedance is matched to the impedance of the filter as seen from its output when its inputs are connected to the input circuit; the purpose of this matching is to optimize signal power transfer.

The input and output impedances of the filter and the characteristic impedance of each of the resonators are most often chosen to have a common standard value. The common standard values are most often 50 ohms, 100 ohms and possibly 200 ohms (notably for differential operation).

One example of a resonator particularly suitable for radio-frequency transmission systems is the Bulk Acoustic Wave (BAW) resonator enabling resonance to be obtained at frequencies of the order of 800 MHz to 3 GHz corresponding to the UHF bands routinely employed in modern telecommunication systems. The resonator is constituted, for example, by a substrate recessed on the rear face, a support membrane over the recess, and a layer of piezoelectric material sandwiched between two metal electrodes. The resonant frequency of this resonator may be adjusted by loading the stack of layers with an additional layer that adds mass to the stack and thus reduces the resonant and antiresonant frequencies.

These resonators have a high quality factor and are of very small size. They are not easy to use, however, when there are required simultaneously a very low bandwidth, a band that is flat in the wanted band, and low consumption of the filter structure that incorporates the resonators.

SUMMARY

An objective of the present invention is to propose a new filter structure based on passive resonators operating at UHF frequencies enabling the required small bandwidth to be obtained, without ripple in the band, and with low electrical consumption of the circuits associated with the input and the output of the filter. An aim of the invention is further to obtain a filter structure having a flatter frequency response curve in the wanted band than may be achieved with structures using a single resonator.

The invention proposes a filter device including an input electronic circuit having an output admittance Yin, an output electronic circuit having an input admittance Yout, a filter having a differential input connected to the input circuit and a differential output connected to the output circuit, the filter comprising a plurality of resonators of two types connected between the input and the output of the filter, the resonators of the first type having a resonant frequency Fr1 and an antiresonant frequency Fa1 and the resonators of the second type having a resonant frequency Fr2 and an antiresonant frequency Fa2 respectively different from Fr1 and Fa1, characterized in that the reciprocal of the real part of the admittance Yin (1/Re{Yin}) and the reciprocal of the real part of the admittance Yout (1/Re{Yout}) are greater than k times the value of the geometric mean of the characteristic impedances (Zc) of the resonators, k being a number at least equal to 2, and in that the frequency differences Fa1−Fr1 and Fa2−Fr2 are greater than k' times the absolute value of the difference Fr1−Fr2, k' being a number at least equal to 2.

The difference between the antiresonant frequency and the resonant frequency is preferably (approximately) the same for the resonators of both types.

The modulus of the output admittance of the input circuit is preferably equal to the modulus of the input admittance of the output circuit.

The number k is preferably greater than or equal to 5. The number k' is preferably greater than or equal to 3.

The filter preferably comprises at least one lattice cell constituted of four resonators, two resonators of the first type and two resonators of the second type, mounted in crossed manner between two terminals of the differential input and two terminals of the differential output of the filter.

Thus according to one aspect of the invention a lattice filter having two types of resonator is coupled to an input electrical circuit and an output electrical circuit, these two circuits having high input and output impedances, rather than attempting to use, in the conventional way, input and output circuits having impedances matched to the characteristic impedance of the resonators. By simultaneously reducing the difference between the resonant frequencies of the two types of resonator, the required bandwidth of the filter is obtained without risk of attenuation (which would necessarily occur if this difference were reduced in a conventional configuration with matched impedances). It is found that a relatively flat and narrow bandwidth may be obtained whilst benefiting from the reduced electrical consumption of the input and output circuits thanks to the high levels of impedance.

To summarize, although a conventional configuration of filter devices using lattice filters would normally use matched impedances at the input and the output and approximate coincidence of the resonant frequency of one type of resonator and the antiresonant frequency of the other type, the invention proposes a configuration with greatly mismatched impedances and a greatly reduced difference between the resonant frequencies of the two types of resonator.

BRIEF DESCRIPTION OF THE DRAWINGS

Other features and advantages of the invention will become apparent on reading the following detailed description with reference to the appended drawings, in which.

DETAILED DESCRIPTION

Figures 1, 2, 3:
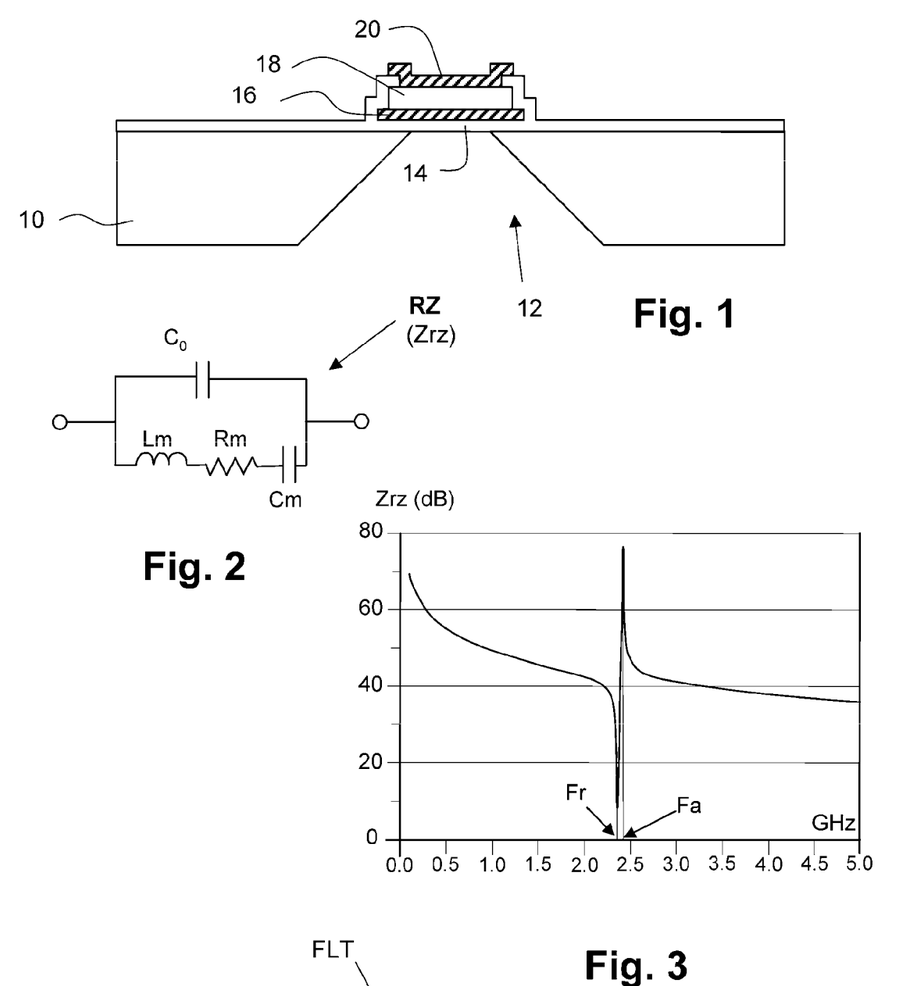
FIG. 1 represents a bulk acoustic wave resonator structure usable in the invention.
FIG. 2 represents a simplified equivalent electrical circuit of the resonator around its main resonance.
FIG. 3 shows a graph that represents the modulus of the impedance of the resonator as a function of frequency with a minimum at its resonant frequency and a maximum at its antiresonant frequency.

FIG. 1 shows diagrammatically the hardware construction of an example of a bulk acoustic wave resonator in a so-called Film Bulk Acoustic Resonator (FBAR) configuration. This view is a view in section. A substrate 10 carries above a recess 12 a membrane 14 and, thereon, a stack of layers constituting the resonator proper. The stack comprises at least one lower electrode 16, a piezoelectric layer 18 and an upper electrode 20. The piezoelectric layer 18 is represented as a single layer but may be composed of a plurality of layers. The lateral dimensions of the stack of layers, outside the section plane, may be several tens of micrometers on each side for a thickness of the order of 1 micrometer. The shape as seen from above is preferably square or substantially square. The FBAR embodiment shown in FIG. 1 is not limiting on the present invention, and, if the bulk acoustic wave technology is used, could be replaced by a Solidly Mounted Resonator (SMR) type configuration relying on the use of an acoustic reflector.

Around its main resonance, a resonator RZ of this type may be modeled by an equivalent electrical circuit constituted of a capacitor $C_0$ in parallel with a series-connected combination of an inductor Lm, a resistor Rm, and another capacitor Cm, as in the FIG. 2 diagram. It has an impedance Zrz between its terminals, varying with frequency.

The resonator has a resonant frequency Fr and an antiresonant frequency Fa. The resonant frequency is close to the antiresonant frequency and lower than it. The modulus of the impedance |Zrz| of the equivalent circuit of the resonator varies with frequency as shown by the FIG. 3 curve in which |Zrz| is represented in decibels (20 log(|Zrz|)). FIG. 3 shows clearly the resonant frequency for which the impedance tends toward zero and the antiresonant frequency for which the impedance becomes very high.

The characteristic impedance Zc of a resonator is given by $1/2\pi F_0 C_0$ where $F_0$ is the center operating frequency between the resonant frequency and the antiresonant frequency. It thus depends primarily on the value of the equivalent capacitor $C_0$.

This capacitor $C_0$ has a value that is linked to the technological production data and to the form factor (thickness/lateral dimension) of the stack of layers, the capacitance being proportional to the ratio between the area of the resonator and the thickness of the piezoelectric layer.

At the frequencies of the order of 2 GHz that are of great interest, the characteristic impedance of the smallest resonator is difficult to increase beyond 200 ohms if the resonator complies with a minimum form factor of approximately 2%; above 2%, undesirable bulk acoustic wave propagation modes appear, inducing spuriae in the frequency band in which it is required to operate.

This means that there is not an entirely free choice of characteristic impedance.

It will further be noted that the difference Fa−Fr between the antiresonant frequency and the resonant frequency is proportional to a technological parameter "$kt^2$" that represents the efficiency of the coupling between the electrical energy and the mechanical energy of the resonator. This parameter depends on the physical characteristics of the resonator, and firstly on the nature of the piezoelectric material employed. Thus in theory the resonator may be produced with a difference Fa−Fr adjustable around a value intrinsic to the piezoelectric material.

In practice, for reasons of efficient operation in radiofrequency systems, and proven technology, filters easily available off the shelf are produced with resonators having a coefficient $kt^2$ that is of the order of 6% and with a characteristic impedance of the order of 50 ohms to 100 ohms at the center frequency for which they were designed.

Finally, two resonators with identical or substantially identical characteristics in terms of characteristic impedance and the parameter $kt^2$ but with different resonant frequencies may be produced in the same technology by simple means such as depositing an additional layer on top of the FIG. 1 stack of one of the resonators, for example, the other not having this additional layer. The additional layer is a dielectric layer such as silicon nitride or silicon oxide or a metal layer. It generally lowers the resonant frequency by adding weight to the structure without modifying the electrical characteristics of the equivalent capacitor $C_0$.

Figure 4:
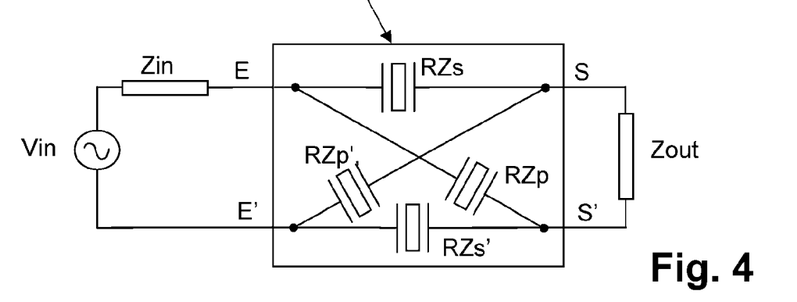
FIG. 4 represents a filter constituted of a lattice cell with four resonators used in the invention.

FIG. 4 represents diagrammatically a filter device general structure. A filter constituted of a single symmetrical lattice cell FLT with four resonators RZs, RZs', RZp, RZp' having a differential input (E; E') and a differential output (S; S') is inserted between an input circuit and an output circuit. Each of these circuits may be active or passive. The input circuit is symbolized by a voltage source Vin in series with an impedance Zin that will be referred to as the output impedance of the input circuit and that may also be considered as a "load impedance at the input of the filter". The output circuit is symbolized by an impedance Zout that will be referred to as the input impedance of the output circuit and that may also be considered as a "load impedance at the output of the filter". The resonators RZs and RZs' constitute a first type of resonator known as a "series resonator": RZs is in series between the input E and the output S; RZs' is in series between the input E' and the output S'. The resonators RZp and RZp' constitute a second type of resonator, known as a "parallel resonator". They are connected in a crossed manner compared to the other two, i.e. RZp is connected between the input E and the output S' and RZp' is connected between the input E' and the output S. This arrangement constitutes what is known as a passive lattice filter with four resonators.

The resonators RZs, RZs' have a resonant frequency Fr1 and an antiresonant frequency Fa1 where Fr1<Fa1.

The resonators RZp, RZp' have a resonant frequency Fr2 and an antiresonant frequency Fa2 where Fr2<Fa2.

The resonant frequency Fr2 of the resonators of the second type (parallel resonators) is by convention lower than the resonant frequency Fr1 of the resonators of the first type (series resonators). By virtue of the symmetry of the lattice arrangement, and the application of differential signals to its input and its output, the parallel resonators could replace the series resonators without modifying the overall electrical behavior.

Conventionally, Zin would be made equal to Zout and this common impedance would be made approximately equal to the geometric mean of the characteristic impedances of the series resonators $Zc_s$ and parallel resonators $Zc_p$: Zin=Zout= $(Zc_s \cdot Zc_p)^{1/2}$. The antiresonant frequency Fa2 of the parallel resonators would also be made approximately equal to the resonant frequency Fr1 of the series resonators. This arrangement enables a filter to be obtained with maximum bandwidth, minimum insertion losses and minimum ripple within the bandwidth.

Still in the conventional way, the characteristic impedance of the resonators, defined above as the modulus of the impedance of the equivalent capacitor of the resonators at the center frequency of the filter for which they were designed, typically takes standard values of 50 or 100 Ohms, or even 200 Ohms.

Figure 5:
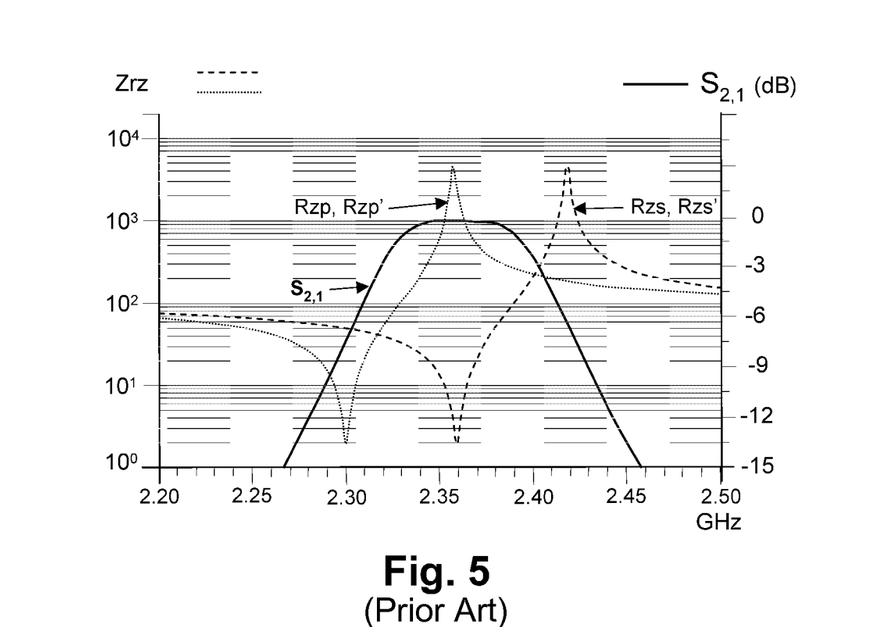
FIG. 5 shows a graph that represents the modulus of the transmission coefficient of a prior art lattice filter loaded by matched input and output impedances.

FIG. 5 comprises three curves that illustrate the behavior of a conventional lattice filter with four resonators; the parallel resonators RZp and RZp' are loaded by an additional layer that lowers their resonant frequency. The curves have frequency plotted on the abscissa axis and, respectively, on the ordinate axis:

- the modulus of the impedance (in ohms) of the resonators RZp or RZp': dotted line curve referenced to the left-hand scale;
- the modulus of the impedance (in ohms) of the resonators RZs or RZs': dashed line curve referenced to the left-hand scale;
- the modulus of the transmission coefficient $S_{2,1}$ (in dB) of the lattice filter produced with the four resonators RZs, RZs', RZp and RZp': solid line curve referenced to the right-hand scale.

It is seen that the antiresonant frequency of the resonators RZp and RZp' has been made substantially equal to the resonant frequency of the resonators RZs and RZs'. The difference Fr1−Fr2 between the resonant frequencies of the two types of resonator is substantially equal to the difference Fa2−Fr2 or Fa1−Fr1 between the antiresonant frequency and the resonant frequency of a resonator.

It is also seen that the filter has a 3 dB bandwidth that is flat and extends over slightly more than this frequency difference.

According to one aspect of the invention, the output impedance of the input circuit Zin and the input impedance of the output circuit of the filter Zout, i.e. the load impedances at the input and at the output of the filter, are assigned values that are not matched to the characteristic impedance of the resonators.

To be more precise, there is assigned to the reciprocal of the real part of the output admittance of the input circuit Re{Yin}, Yin being the output admittance 1/Zin of the input circuit, a value at least k times greater than the characteristic impedance of the resonators, k being a number greater than or equal to 2. If the characteristic impedances of the series and parallel resonators are different, there is taken as the characteristic impedance of the resonators the geometric mean of the characteristic impedances of the series and parallel resonators. For example, if the equivalent capacitors $C_0$ of the resonators in reality comprise different capacitors $C_{0s}$ and $C_{0p}$ for the series and parallel resonators, respectively, then the characteristic impedance Zc is considered to be $[1/(C_{0s} \cdot C_{0p} \omega_0^2)]^{1/2}$.

An input circuit (signal source) is therefore used having an output impedance Zin, connected to the input terminals E and E' of the filter and an output circuit (filter load) having an input impedance Zout connected to the output terminals of the lattice filter.

According to the invention, the output admittance Yin=1/Zin of the input circuit has a real part Re{Yin}, the reciprocal 1/Re{Yin} of which is at least k times greater than Zc. The admittance of the output circuit has a real part Re{Yout}, the reciprocal 1/Re{Yout} of which is also at least k times greater than Zc.

$$1/\text{Re}\{Yin\} \geq k \cdot Zc$$

$$1/\text{Re}\{Yout\} \geq k \cdot Zc$$

The multiplier factor k, at least equal to 2, is preferably greater than or equal to 5. The number k is a positive number but is not necessarily an integer.

However, if 1/Re{Yin} and 1/Re{Yout} are merely increased in this way, there is the risk of obtaining a filter template as a function of frequency that includes ripple within the band that may exceed several dB. Such levels of ripple within the band are typically unacceptable.

Figure 6:
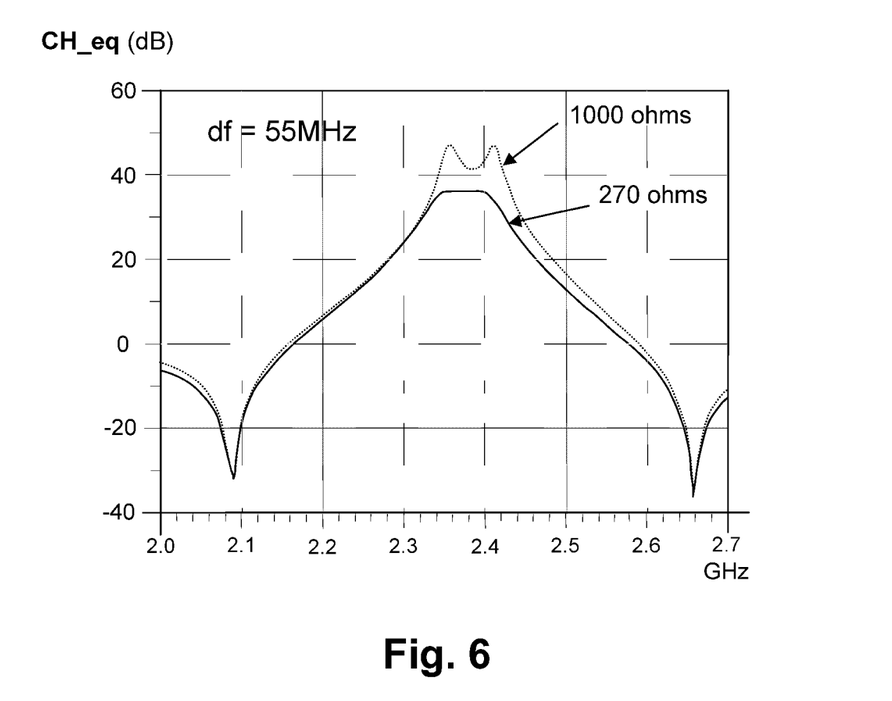
FIG. 6 shows a graph that represents the modulus of the equivalent load of a filter for two different values of the input and output impedance (270 ohms and 1000 ohms)

FIG. 6 shows the general trend of the modulus of the "equivalent load" (in decibels) of the same filter for two different values of the input and output impedance (270 ohms and 1000 ohms); the idea of "equivalent load" is enlarged upon later; shown in solid line, the input and output impedance is matched to the characteristic impedance of the resonators of the filter, whereas, shown in dotted line, the input and output impedance is considerably greater than the characteristic impedance. The equivalent load represents the voltage gain between the input of the input circuit and the output of the filter when the input circuit is connected to the inputs E and E' of the filter, the output of which is loaded by an impedance Zout and when the equivalent transconductance of the input circuit is equal to 1. It will be seen later that this equivalent load curve is representative of the transmission coefficient $S_{2,1}$ of the filter.

On this explanatory curve it is assumed for simplicity that the input impedance and the output impedance are real. By way of example an impedance of 270 ohms is indicated for the first curve and an impedance of 1000 ohms for the second curve, both at the input and at the output. The frequency difference between the resonant frequencies of the two types of resonator employed in this filter is 55 MHz, for example, and this difference corresponds to the difference between the resonant frequency and the antiresonant frequency of the resonators. It is seen that the curve for a mismatched impedance of 1000 ohms includes unwanted ripple within the wanted band.

According to one aspect of the invention, to eliminate this ripple, the difference Fr1−Fr2 between the resonant frequencies of the two types of resonator is greatly reduced instead of keeping it substantially equal to the difference Fa1−Fr1 (or Fa2−Fr2) between the resonant and antiresonant frequencies of a resonator.

To be more precise, Fa1−Fr1 and Fa2−Fr2 are assigned values at least k' times greater than Fr1−Fr2, k' being a coefficient at least equal to 2.

$$Fa1-Fr1 >= k' \cdot (Fr1-Fr2)$$

$$Fa2-Fr2 >= k' \cdot (Fr1-Fr2)$$

with k'>=2

Figure 7:
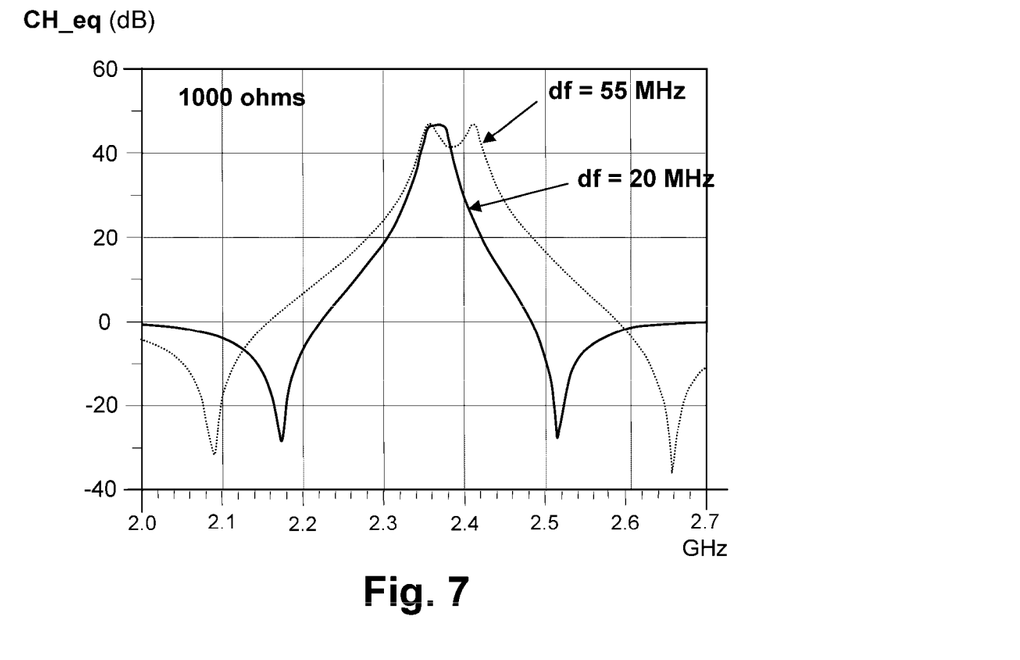
FIG. 7 shows a graph that represents the modulus of the equivalent load for an input and output impedance of 1000 ohms when the difference between the resonant frequencies of the two types of resonator of the filter takes two different values.

FIG. 7 shows, to the same scale as FIG. 6, the curve of the modulus of the equivalent load (in decibels) of the filter that may be obtained by this operation. In FIG. 7, the dotted line curve represents as in FIG. 6 the equivalent load of the filter (with ripple) when the load impedance at the input of the filter and the load impedance at the output are much greater than the characteristic impedance of the resonators; the solid line curve represents the equivalent load of the filter when, with the same high load impedances at the input and the output, the difference Fr1−Fr2 between the resonant frequencies of the resonators is divided by a factor k' of approximately 3 without altering their technology, i.e. without altering the parameter $kt^2$ that governs the difference between resonance and antiresonance. The frequency difference df=Fr1−Fr2 is reduced from 55 MHz to 20 MHz in this example.

It is seen that the equivalent load (or its image, the transmission coefficient) then has a narrow flat bandwidth with no ripple in the useful band.

In this example, the 3 dB bandwidth is slightly greater than the difference Fr1−Fr2 (between 1.5 times and twice that difference).

The multiplier coefficient k', at least equal to 2, is preferably greater than or equal to 3. The number k' is a positive number but is not necessarily an integer.

Figure 8:
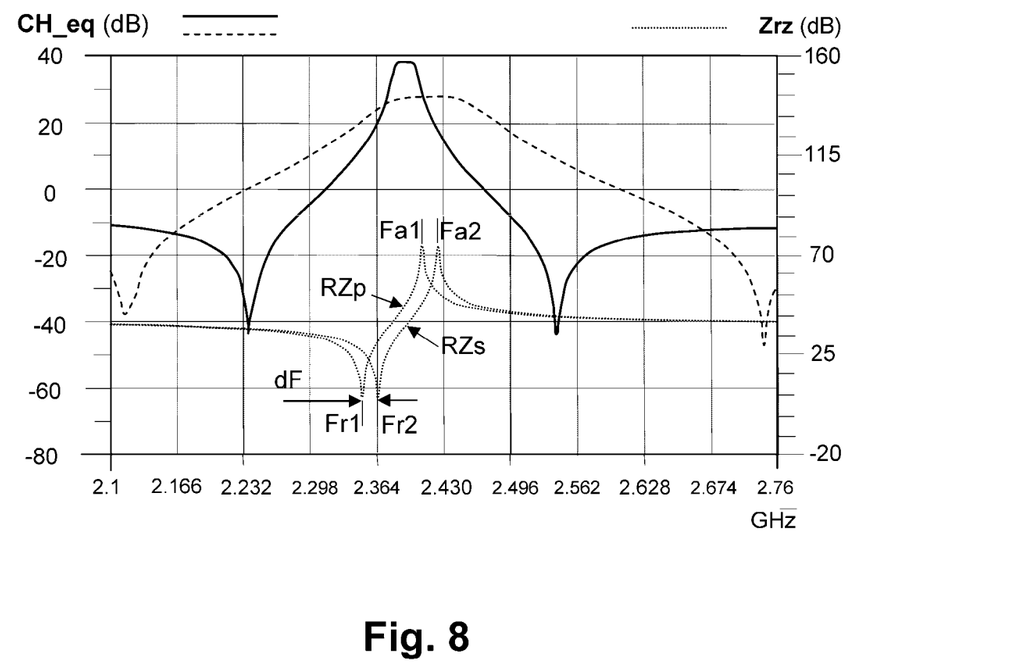
FIG. 8 shows a graph that represents the modulus of the equivalent load in a conventional structure and in a filter structure of the invention.

FIG. 8 shows in detail the curves of the modulus of the equivalent load of a filter of the invention (in solid line) and a filter of conventional design (in dashed line) as a function of frequency. The corresponding impedance curves of the resonators RZp and RZs employed in the filter of the invention are shown in dotted line with the same frequency scale on the abscissa axis to show clearly the small frequency difference between the resonators of the two types. The two filters compared in this figure have resonators based on the same technology ($kt^2$=6%, quality factor 1000, value of main capacitor $C_0$ 700 femtofarads). The filter of the invention uses input load and output load impedances Zin and Zout equal to 500 ohms in series with 0.5 picofarads; the filter of conventional design uses impedances Zin and Zout of 100 ohms. The first filter is formed with a resonator frequency difference of approximately 10 MHz. The filter of conventional design is produced with a difference of 65 MHz, approximately corresponding to the difference between resonance and antiresonance.

Figure 9:
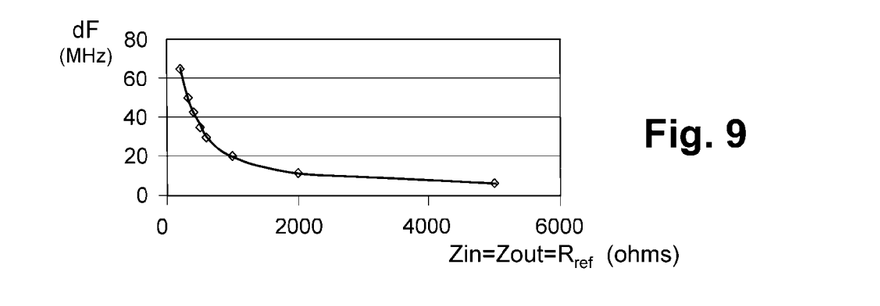
FIG. 9 shows a graph that represents a curve of variation of the desirable frequency difference as a function of the input or output impedance for a filter produced with resonators employing the standard BAW technology and centered at 2350 MHz.

FIG. 9 shows, for a filter using resonators having the above characteristics, the frequency difference value that it is desirable to use as a function of the input and output impedance connected to the filter (assumed real and equal to a variable value $R_{ref}$) to obtain a filter of the invention having residual ripple within the wanted band less than 0.1 dB.

Given that the impedances Zin and Zout are now much higher than the characteristic impedance of the resonators (which in practice is imposed by the technology), it will be clear that electrical consumption of the input and output active circuits may be reduced commensurately. The fact that the output impedance of the input electronic circuit is low implies the necessity to use current sources of greater amplitude to obtain the same voltage gain if it is considered that the supply voltage of the circuits (for example 1.2 volts or 2.5 volts) is generally imposed. This is also true for the output electronic circuit.

The FIG. 6 and FIG. 7 curves are of course compared with the same resonators. It will be clear that the bandwidth may be adjusted further by modifying the characteristics of the resonator and notably the value of its main capacitor $C_0$ and its electromechanical coupling coefficient $kt^2$.

Figure 10:
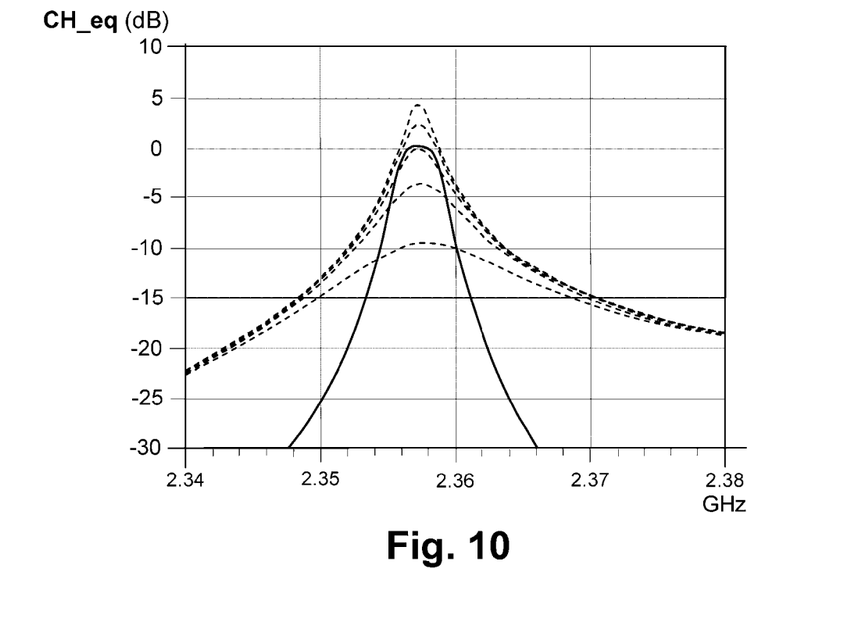
FIG. 10 shows a graph that represents comparative response curves as a function of frequency for the invention and for a single resonator filter when the quality factor of the latter is varied from 200 to 1000.

FIG. 10 shows the advantage of using the filter device of the invention over an active filter using a single resonator at its resonant or antiresonant frequency. Using a resonator operating at its resonant frequency enables high selectivity to be obtained provided that the resonator has a high quality factor. The dotted line curves represent the frequency response curves of the active filter for five different quality factors of the resonator, the most spiky curve being the curve obtained with the highest quality factor (1000) and the flattest curve being that obtained with the lowest quality factor (200). It is clearly seen that a high selectivity and thus a narrow bandwidth necessarily implies that the response is not flat in the wanted band.

For comparison, the solid line curve evokes the response of a filter produced in accordance with the invention using resonators for which the quality coefficient has a value of 1000.

This figure shows that it is possible to obtain a response curve that may be both highly selective (narrow bandwidth) and much flatter at the top of the wanted band. The selectivity of the filter produced in accordance with the invention is also much less sensitive to the value of the quality factor of the resonators, which is a parameter that it is generally difficult to control precisely.

The foregoing description considers that the output impedance of the input circuit is identical to the input impedance of the output circuit at the center frequency. This is a preferred solution, but the impedances could nevertheless be different.

Moreover, these input and output loads may be real but will most often be partly or entirely capacitive. In a CMOS circuit, to optimize the voltage gain of a function, it is relatively common practice to use high-impedance interfaces between the blocks, for example by the direct interconnection to the gate of a CMOS transistor of small size. It is therefore common practice to employ capacitive loads of low value.

To understand better how the filter device behaves when the input impedance and the output impedance of the filter have been increased (or to be more precise when the reciprocal of the real part of the input or output admittance has been increased) it is possible to reason in terms of "equivalent load", which is a concept that the circuit designer finds very useful.

Figure 11:
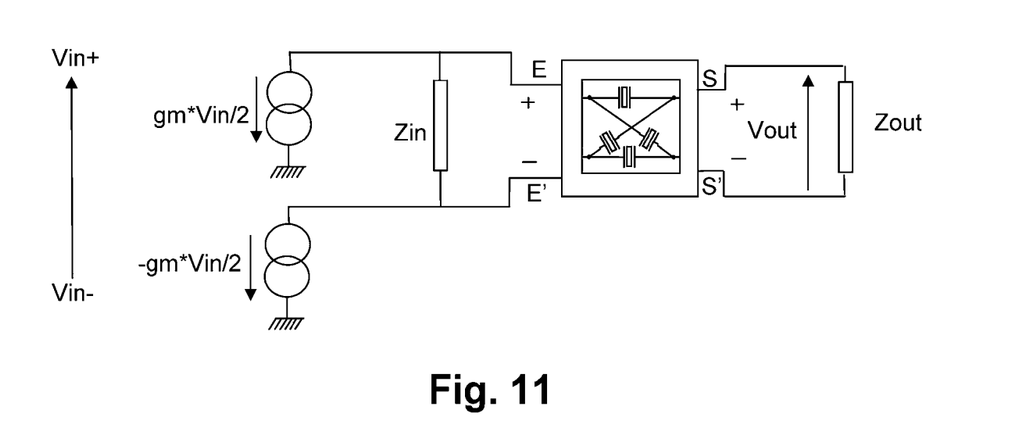
FIG. 11 represents a diagram of the filter structure in which the input circuit is represented by its Norton type equivalent.

To define the equivalent load, the input circuit is modeled by a Norton equivalent circuit as shown in FIG. 11, which comprises 1) two transconductances of value $g_m$ producing input currents $I=g_m Vin/2$ and $-I=-g_m Vin/2$ when a differential voltage Vin is applied between the inputs of the transconductances, and 2) a differential output impedance Zin.

The "equivalent load" is the voltage gain between Vin and Vout divided by the transconductance $g_m$ when the input terminals E, E' of the filter are connected to the terminals of an impedance Zin and the output terminals S, S' of the filter are connected to the terminals of an impedance Zout. The output voltage Vout is that developed between the terminals S and S' of the filter. The equivalent load thus represents the voltage gain for a transconductance $g_m$ assumed to be equal to 1.

The passive filter itself is characterized by a matrix of impedances (Z matrix):

Filter Z matrix $$\begin{vmatrix} Z_{11}, Z_{12} \\ Z_{21}, Z_{22} \end{vmatrix}$$

The gain Vout/Vin may be expressed as the ratio:

$$Vout/Vin=-[g_m \cdot Z_{21} \cdot Zin \cdot Zout]/2 \cdot [Zout \cdot Zin+Zout \cdot Z_{11}+Z_{22}\cdot Zin+Z_{11}\cdot Z_{22}-Z_{21}\cdot Z_{12}]$$

If the matrix is reciprocal (i.e. $Z_{11}=Z_{22}$ and $Z_{12}=Z_{21}$), which is the case with a lattice filter, we may write:

$$Vout/Vin=-[g_m \cdot Z_{21} \cdot Zin \cdot Zout]/2 \cdot [Zout \cdot Zin+Zout \cdot Z_{11}+Z_{11}\cdot Zin+Z_{11}^2-Z_{21}^2]$$

This equation shows that the voltage gain is the product of the transconductance $g_m$ of the input active circuit and a term that represents an impedance that might be called the equivalent load CH_eq of the input circuit.

The equivalent load is then written:

$$CH\_eq=[Z_{21} \cdot Zin \cdot Zout]/2 \cdot [Zout \cdot Zin+Zout \cdot Z_{11}+Z_{11}\cdot Zin+Z_{11}^2-Z_{21}^2]$$

The transconductance $g_m$ of the input circuit will be that of an output transistor of this input circuit, for example; to the first order, the transconductance of a transistor varies in proportion to its bias current and the value of the latter impacts directly on electrical consumption; consequently, it is clear that to minimize the electrical consumption of the input circuit for a given voltage gain it is of benefit to reduce the transconductance. For a given voltage gain, reducing the transconductance requires a commensurate increase in the value of the equivalent load CH_eq since the voltage gain Vout/Vin is proportional both to the transconductance and to the equivalent load.

It is thus clear that increasing the equivalent load may end up reducing the energy consumption of the input circuit if this is an active circuit. Moreover, because in the context of integrated circuit design it is typically easy to produce high impedances with low bias currents, the benefit is clear of working with high values of Zin and Zout to reduce further the electrical consumption of the input and output circuits if they are active circuits.

To preserve the symmetry of the filter function of the lattice filter relative to the central frequency, impedances Zin and Zout are taken that are equal at the input and at the output, or at least equal in terms of their modulus (|Zin|=|Zout|).

Hereinafter it is assumed that Zout=Zin.

If the impedances Zin and Zout are real and equal to a resistive value $R_{ref}$, the value of the transmission coefficient $S_{21}$ of the filter may quite easily be expressed:

$$S_{21}=2\cdot[Z_{21}\cdot(Zin\cdot Zout)^{1/2}]/[Zout\cdot Zin+Z_{11}\cdot Zout+Z_{22}\cdot Zin+Z_{11}\cdot Z_{22}-Z_{12}\cdot Z_{21}]$$

and if Zin and Zout are replaced by $R_{ref}$, returning to the equation giving the equivalent load and now expressing it as a function of $S_{21}$, it is found that the equivalent load is:

$$CH\_eq=R_{ref}\cdot S_{21}/4$$

In the above equation, $S_{21}$ is the value of the transmission coefficient of the filter assumed to be loaded by Zin at the input and Zout at the output, and thus by $R_{ref}$ on each side.

This calculation shows that the transmission coefficient is proportional to the equivalent load and this is why the curves in FIGS. 6, 7, 8 and 10 that have equivalent loads plotted on the ordinate axis also represent the transmission coefficient of the filter.

For a filter having low losses, which is the case when it is designed with resonators with a high quality factor, the value of $S_{21}$ is close to 1 in the bandwidth of the filter. This therefore means that the equivalent load is globally proportional to the resistance $R_{ref}$ of the input and output load, whence the benefit of increasing this resistance if the equivalent load is required to be high. The equivalent load is in fact practically equal to $R_{ref}/4$ in the wanted band (note that it departs from this value if $R_{ref}$ is greatly increased).

Mathematical reasoning would make it possible to show that the transmission response $S_{21}$ (calculated relative to the reference $R_{ref}$) is not changed if the resistance $R_{ref}$ is multiplied by a coefficient and that, in parallel with this, resonators are used in which the value of the capacitor $C_o$ is divided by the same coefficient. However, as explained above, the size of the resonator cannot be reduced indefinitely without interfering with the resonance, and moreover this would not reduce the bandwidth.

It could also be shown that the transmission response $S_{21}$ (calculated relative to the reference $R_{ref}$) would not change if the resistance $R_{ref}$ were multiplied by two or three (or more) and if two or three (or more) resonators were connected in series instead of only one in each branch of the lattice filter; however, multiplying the number of resonators in this way has a cost and leads to an increase in the overall size of the filter, and once again would not reduce the bandwidth of the filter.

By modifying the frequency difference between the two resonators at the same time as increasing $R_{ref}$, there is obtained in the end both a possibility of reducing the consumption of the input and/or output active circuits and a narrow bandwidth without ripple, without it being necessary to reduce the electromechanical coupling coefficient of the resonators as would be the case in a resonator-based narrowband filter of conventional design.

With a view to simplification, the foregoing explanations have been given assuming that the input and output impedances Zin and Zout are resistive. They may be purely capacitive or complex, however. The typical situation of a capacitive impedance is the situation in which the output of the lattice filter is connected to the gates of MOS transistors.

It can be shown that if the impedance Z=Zin=Zout is complex, the situation is the same as the preceding situation of a real impedance with $R_{ref}=1/\text{Re}\{1/Z\}$ on condition of considering that a virtual capacitor of value $\text{Im}\{1/Z\}/(2\pi f)$, where f is the frequency, has been connected in parallel with each of the four resonators of the lattice filter. The effect of this virtual capacitor is a virtual reduction in the coupling coefficient $kt^2$ of the resonators and an increase in the value of their main capacitor $C_0$, but the reasoning in terms of equivalent load remains the same.

This is why, in the case of complex input and output load impedances, the invention proposes considering not the modulus of the input and output load impedances connected to the terminals of the lattice filter, but more precisely the reciprocal of the real part Re{Yin} of the input admittance and the reciprocal of the real part Re{Yout} of the output admittance: it is these values that must be greater than k times the value of the characteristic impedance Zc of the resonators, k being a number at least equal to 2, as indicated above.

The invention may notably be applied in receivers using an intermediate frequency of the order of 1 GH$_z$. In this type of receiver, the useful signal picked up by the antenna, for example at a UHF frequency, is mixed with a signal from a variable frequency local oscillator. The signal resulting from mixing and where appropriate amplified is filtered by a narrowband intermediate frequency filter produced in accordance with the principles of the present invention. This filter may have a number of functions: selection of the band corresponding to the channel to reduce selectivity and linearity constraints on subsequent stages of the reception chain; attenuation of an image band of a second intermediate frequency; attenuation of spectrum aliasing bands during a sample or decimation process.

The useful signal, now at the intermediate frequency, may thereafter be translated toward the baseband or toward a second intermediate frequency lower than the first. This translation may be effected with the aid of a second mixer, for example, or by undersampling at a frequency lower than the first intermediate frequency. In both these cases, the filter device may be used to eliminate signals that could otherwise show up in the wanted band (this is called aliasing). In the case of frequency translation by undersampling, the filter device is placed between the mixer that produces the signal at the first intermediate frequency and the undersampling circuit, the latter constituting the load of the lattice filter.

The invention may also be applied to a receiver of very low consumption for the "wake-up" application. A wake-up receiver is a radio-frequency receiver of reduced performance but of very low electrical consumption. It complements a receiver offering better performance but with higher consumption and which must operate only during limited time intervals in order to preserve energy resources. The wake-up receiver may remain turned on at all times or be turned on more regularly than the main receiver. It may be used in a network of sensors to reduce the communication latency time, simplify synchronization, and optimize throughput. The use of a filter designed to reduce consumption is thus particularly appropriate for this type of receiver.

The person skilled in the art is in a position to imagine other embodiments of the present invention.

Inter alia, diverse types of resonator could be used having a resonant frequency and an antiresonant frequency, for example surface acoustic wave (SAW) resonators, bulk acoustic wave (BAW) resonators, lamb wave resonators, MEMS resonators.

Moreover, the lattice filters may be constituted of a plurality of lattice or other cells.

Also, the device of the invention may advantageously be produced on the same electronic chip or the same chip set, for example using "3D" chip assembly techniques.

The invention claimed is:

1. A filter device comprising:
   an input electronic circuit having an output admittance Yin;
   an output electronic circuit having an input admittance Yout;
   a filter having a differential input connected to the input electronic circuit and comprising a plurality of resonators of a first type and a second type connected between an input and an output of the filter, the plurality of resonators of the first type having a resonant frequency Fr1 and an antiresonant frequency Fa1 and the plurality of resonators of the second type having a resonant frequency Fr2 and an antiresonant frequency Fa2 respectively different from the resonant frequency Fr1 and the antiresonant frequency Fa1; and
   a differential output of the filter connected to the output electronic circuit, wherein:
   the reciprocal of the real part of the output admittance Yin and the reciprocal of the real part of the input admittance Yout are greater than k times the value of the geometric mean of characteristic impedances of the plurality of resonators, k being a number at least equal to 2, and
   frequency differences between the antiresonant frequency and the resonant frequency for the resonators of the first type and the plurality of resonators of the second type, Fa1−Fr1 and Fa2−Fr2, respectively, are greater than k' times the absolute value of the frequency difference Fr1−Fr2, k' being a number at least equal to 2.

2. The device according to claim 1, wherein the difference between the antiresonant frequency and the resonant frequency for the plurality of resonators of the first type, Fa1−Fr1, is substantially the same as the difference between the antiresonant frequency and the resonant frequency for the plurality of resonators of the second type, Fa2−Fr2.

3. The device according to claim 1, wherein the real part of the output admittance Yin of the input electronic circuit is equal to the real part of the input admittance Yout of the output electronic circuit.

4. The device according to claim 3, wherein
   the filter comprises at least one lattice cell of two resonators of the first type and two resonators of the second type, said two resonators of the first type and said two resonators of the second type belonging to said plurality of resonators,
   the differential input has two input terminals E and E',
   the differential output of the filter has two output terminals S and S', one of said two resonators of the first type is placed between the input E and the output S, another one of said two resonators of the first type is placed between the input E' and the output S', one of said two resonators of the second type is placed between the input E and the output S', and another one of said two resonators of the second type is placed between the input E' and the output S.

5. The device according to claim 1, wherein the number k' is greater than or equal to 5.

6. The device according to claim 1, wherein the number k' is greater than or equal to 3.

7. The device according to claim 1, wherein:

the filter comprises at least one lattice cell of two resonators of the first type and two resonators of the second type, said two resonators of the first type and said two resonators of the second type belonging to said plurality of resonators, the differential input has two input terminals E and E', the differential output of the filter has two output terminals S and S', one of said two resonators of the first type is placed between the input E and the output S, another one of said two resonators of the first type is placed between the input E' and the output S', one of said two resonators of the second type is placed between the input E and the output S', and another one of said two resonators of the second type is placed between the input E' and the output S.

8. The device according to claim 1, wherein the plurality of resonators are bulk acoustic wave resonators or surface acoustic wave piezoelectric resonators.

9. The device according to claim 2, wherein the filter comprises at least one lattice cell of two resonators of the first type and two resonators of the second type, said two resonators of the first type and said two resonators of the second type belonging to said plurality of resonators, the differential input has two input terminals E and E', the differential output of the filter has two output terminals S and S', one of said two resonators of the first type is placed between the input E and the output S, another one of said two resonators of the first type is placed between the input E' and the output S', one of said two resonators of the second type is placed between the input E and the output S', and another one of said two resonators of the second type is placed between the input E' and the output S.

10. The device according to claim 2, wherein the real part of the output admittance Yin of the input electronic circuit is equal to the real part of the input admittance Yout of the output electronic circuit.

11. The device according to claim 2, wherein the number k' is greater than or equal to 3.

* * * * *